United States Patent [19]

Kroger et al.

[11] Patent Number: 4,536,414
[45] Date of Patent: Aug. 20, 1985

[54] SUPERCONDUCTIVE TUNNEL JUNCTION DEVICE WITH ENHANCED CHARACTERISTICS AND METHOD OF MANUFACTURE

[75] Inventors: Harry Kroger, Sudbury; Don W. Jillie, Arlington; Lawrence N. Smith, Lexington, all of Mass.

[73] Assignee: Sperry Corporation, New York, N.Y.

[21] Appl. No.: 458,241

[22] Filed: Jan. 17, 1983

[51] Int. Cl.$^3$ .......................................... H01L 39/22
[52] U.S. Cl. ...................................... 427/38; 427/63; 427/96; 156/643
[58] Field of Search ................... 427/62, 63, 38, 96; 204/192 E; 156/643

[56] References Cited

U.S. PATENT DOCUMENTS 4,333,808  6/1982  Bhattacharyya ...................... 427/81
4,351,712  9/1982  Cuomo et al. ......................... 427/62
4,421,785  12/1983 Kroger ................................. 427/63

OTHER PUBLICATIONS

Broom et al., IBM J. Res. Develop., vol. 24, No. 2, Mar. 1980.

Primary Examiner—Richard Bueker
Attorney, Agent, or Firm—Howard P. Terry; Albert B. Cooper

[57] ABSTRACT

A superconductive tunnel junction device comprises first and second superconductive electrodes with a barrier disposed therebetween where the first superconductive electrode and the barrier are formed without interruption in the same vacuum system pump down and with the first superconductive electrode subjected to sputter etching in an argon plasma before the deposition of the barrier for improving the characteristics of the device.

4 Claims, 4 Drawing Figures

SUPERCONDUCTIVE TUNNEL JUNCTION DEVICE WITH ENHANCED CHARACTERISTICS AND METHOD OF MANUFACTURE

BACKGROUND OF THE INVENTION

1. Field of the Invention

The invention relates to superconductive circuits particularly with respect to superconductive tunnel junction devices.

2. Description of the Prior Art

Superconductive tunnel junction devices are known in the prior art that comprise first and second superconductive electrodes with a tunnelling barrier therebetween. Such devices are typically fabricated by forming a lower superconductive layer on a substrate in a vacuum chamber. The vacuum system is then disrupted and the substrate removed for patterning the lower superconductive layer. A junction-defining insulating layer may also be formed on the lower superconductive layer. The wafer is then returned to the vacuum chamber and after pump down, a sputter etching step performed, often in an argon plasma for cleaning the surface of the superconductive material. The barrier layer is then formed and the remainder of the device completed by known steps.

In these prior art procedures, the lower superconductive electrode is severely contaminated before barrier formation is initiated. The contamination arises from such sources as the use of photoresistive material to pattern the lower superconductive electrode, photoresistive lift-off chemicals, photoresistive stripping agents such as liquid or plasma, photoresistive patterning of junction-defining insulator windows in, for example, a silicon oxide insulating layer, particularly in the instance of refractory material device, and, contact of the lower superconductive electrode surface with laboratory air. Any of these sources may produce significant contamination for the subsequent formation of tunnelling barriers, where even one atomic layer can substantially affect the properties of the tunnel junction device.

Therefore, it is expected that when utilizing these prior art processes, a sputter etch cleaning of the lower superconductive electrode surface would be performed before formation of the barrier.

Such prior art is discussed in Applicants' Assignee's U.S. Pat. No. 4,176,365, issued Nov. 27, 1979. Further examples of such prior art are discussed in an article in the IEEE Transactions on Electron Defices, Volume ED-27, No. 10, October 1980, on page 1998 entitled "Niobium Oxide-Barrier Tunnel Junction" and in the IBM Journal of Research and Development, Volume 24, No. 2, March 1980 on page 212 entitled, "Fabrication and Properties of Niobium Josephson Tunnel Junctions".

In these prior art techniques, it has been observed that depositions and removals of insulator layers, even if followed by a sputter etch cleaning step, can alter the surface of a supeconductive electrode so as degrade tunnel junction properties.

Another example of a prior art procedure for fabricating superconductive tunnel junction devices is found in Applied Physics Letters, Volume 39, No. 3, Aug. 1, 1981, in an article on page 280 entitled "Selective Niobium Anodization Process for Fabricating Josephson Tunnel Junctions". In this process, the lower superconductive electrode is formed on a substrate in the vacuum system. The barrier layer is then formed on the lower superconductor and the upper superconductor is formed on the barrier, in situ, without breaking the vacuum system and removing the substrate therefrom. Since this sandwiched configuration is formed without breaking the vacuum system, the surface of the lower superconductive electrode which forms the interface batween that electrode and the barrier ramains uncontaminated and therefore it saw believed with respect to this prior art process, that a sputter etch cleaning step of the surface of the lower superconductive electrode would not perform a useful function. In an altenative version of this process, the vacuum system may be disrupted after the in situ formation of the barrier and the substrate removed from the vacuum system for a thermal oxidation treatment. Thereafter, the upper superconductive electrode is formed once again in the vacuum system. With this variation, the interface between the lower superconductive electrode and the barrier remains uncontaminated thereby again obviating cleaning the surface of the lower superconductive electrode prior to barrier deposition. Further details of this process may be found in Applicant's Assignee's U.S. patent application Ser. No. 179,311, filed Aug. 18, 1980 in the name of Harry Kroger entitled "Superconductive Tunnel Junction Device and Method of Manufacture" now U.S. Pat. No. 4,421,785.

SUMMARY OF THE INVENTION

The invention comprises a superconductive tunnel junction device having first and second layers of superconductive material which are superposed with respect to each other and a barrier layer superposed between the first and second superconductive layers so that tunnelling current can flow between the superconductive layers through the barrier. The first superconductive layer and the barrier layer are formed in situ in the same pump down of the vacuum system. Prior to formation of the barrier layer, the surface of the first superconductive layer that will be adjacent the barrier is subject to ion bombardment. Interposing the in situ, ion bombardment step between the formation of the first superconductive layer and the formation thereon of the barrier layer yields superconductive tunnel junction devices with characteristics significantly improved with respect to those of devices fabricated by other techniques. Preferably, the ion bombardment treatment is effected by sputter etching in an argon plasma.

The invention also encompasses the method of manufacturing the superconductive tunnel junction device with improved characteristics.

DESCRIPTION OF THE PREFERRED EMBODIMENT

Figure 1:
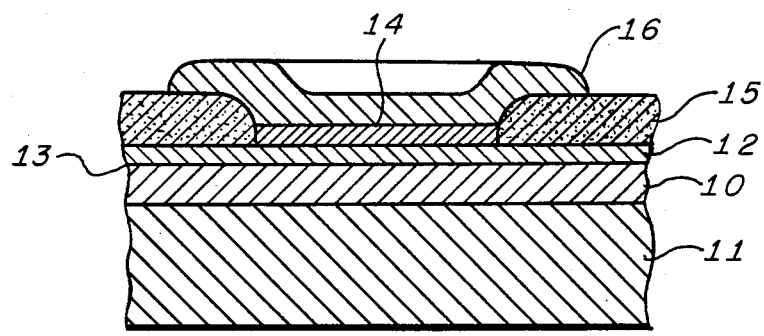
FIG. 1 is a side elevation view of a cross-section of a superconductive tunnel junction device fabricated in accordance with the present invention.
Figure 2:
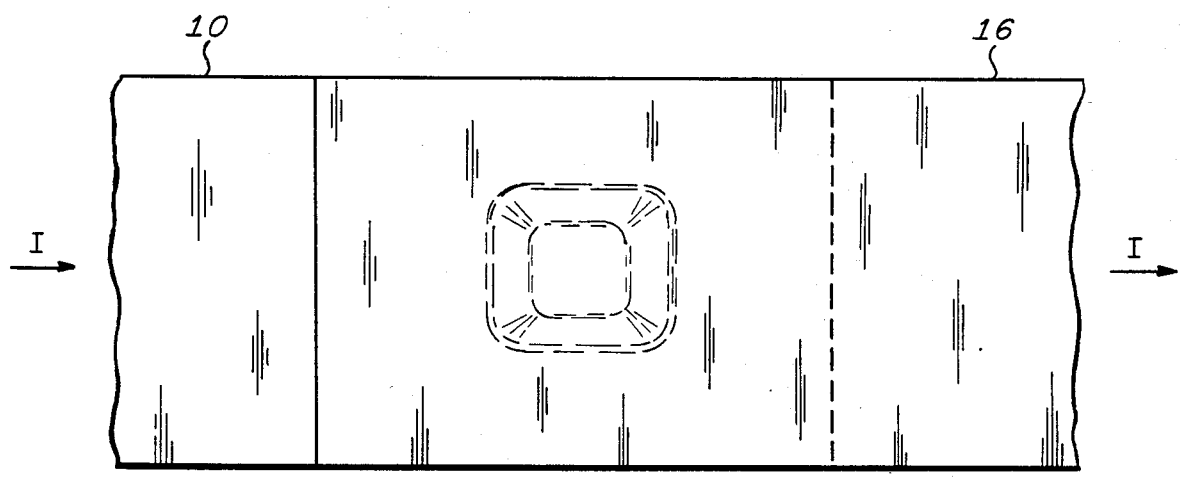
FIG. 2 is a top view of the device of FIG. 1.

Referring to FIGS. 1 and 2, in which like reference numerals indicate like components, a superconductive tunnel junction device fabricated in accordance with the present invention is illustrated. The tunnel junction device comprises a first superconductive electrode 10 deposited on a substrate 11. Deposited on the superconductive electrode 10 is a tunnelling barrier 12. The surface of the superconductive electrode 10 adjacent the barrier layer 12 is denoted by reference number 13. In accordance with the invention, the superconductive electrode 10 and the barrier layer 12 are formed in the same vacuum system pump down and interposed between the formation of the superconductive electrode 10 and the deposition of the barrier layer 12, the surface 13 is subjected to an ion bombardment treatment. Preferably, the treatment comprises sputter etching of the surface 13 and in the preferred embodiment the sputter etching is performed in an argon plasma. It is appreciated, therefore, that the processes of the forming the layers 10 and 12 and the treatment of the surface 13 are performed in situ in the same vacuum chamber without breaking the vacuum system.

Preferably, in the same vacuum system and without interruption, a second superconductive layer 14 is deposited on the barrier 12. Alternatively, without breaking vacuum the barrier 12 may be subjected to an oxidation treatment and/or sputter etching treatments; or the wafer may be removed from the vacuum system for a thermal oxidation treatment of the barrier 12, before returning the wafer to the vacuum system for deposition of the second superconductive layer 14.

The superconductive tunnel junction device illustrated in FIGS. 1 and 2 may be fabricated utilizing the present invention in the context of the process described in said Ser. No. 179,311 and in said Applied Physics Letters of Aug. 1, 1981. Accordingly, the superconductive layer 14 is oxidized in selected areas to isolate the superconductive tunnel junction devices. The oxidized portion of the superconductive layer 14 is depicted at 15. In accordance with the teachings of said Ser. No. 179,311, a superconductive terminal 16 is deposited to make contact with the superconductive electrode 14.

The materials utilized in forming the various layers of FIG. 1 can be any of those discussed in said Ser. No. 179,311; said U.S. Pat. No. 4,176,365; said U.S. Pat. No. 4,220,959 or may comprise other materials known for fabricating such elements of a superconductive tunnel junction device. For example, the superconductive layers 10 and 14 may comprise niobium or niobium nitride and the barrier material 12 may comprise amorphous semiconductor material such as silicon or germanium which may preferably be hydrogenated. The barrier 12 may also constitute a polycrystalline semiconductor such as silicon or germanium.

Preferably, the sputter etch treatment of the surface 13 is performed in a plasma at a pressure between 5 and 50 Millitorr. In the preferred embodiment of the invention, an argon plasma was utilized but it is believed that any gaseous plasma may be suitable in practicing the invention. It is furthermore believed that ion beam etching may be utilized as the ion bombardment treatment of the surface 13.

The ion bombardment treatment of the surface 13 may be at a power sufficient to effect sputter etching, and alternatively at a lower power whereby etching does not occur.

The introduction of the ion bombardment treatment of the surface 13 in the continuous in situ formation of the layers 10 and 12 of the device of FIG. 1 without breaking the vacuum system during the procedure results in a substantial improvement of the subgap current-voltage characteristics of the device. Specifically, the $V_m$ parameter of the current-voltage characteristic of the device is increased. $V_m$ is the product of the subgap resistance and the critical (maximum zero voltage) current. Higher values of $V_m$ generally result in larger gains and improved margins in logic gates. Thus, the invention improves device properties for both latching digital logic and S-I-S (superconductor-insulator-superconductor) mixer and detector applications.

A further benefit of the present invention is that the device exhibits a more abrupt rise in the quasi-particle current at the sum of the energy gaps of the electrodes. This result improves the response of such devices to millimeter radiation for use as a detector or mixer in both the classical and quantum limits. An additional advantage of the more abrupt rise in the quasi-particle current at the sum of the energy gaps is enjoyed in the use of the device in power supply regulators. The more abrupt the jump in current, the more constant will be the voltage supplied, for example, to logic gates. A still further advantage accrued from the invention is that the high resistance in the subgap region is extended to higher voltages. This permits the use of higher critical current junctions and/or higher impedance transmission lines and may also improve device switching speed.

The treatment of the surface 13 in accordance with the present invention also results in the fabrication of superconductive tunnel junction devices with consistently high quality, both uniformly across a wafer and for a very wide range of current densities up to several thousand amperes per square centimeter. High current densities, for example, 1,000 to 10,000 amperes per square centimeter, are required for small dimensioned devices which consequently provide faster switching while preserving margins. Without utilizing the invention, typically, device quality deteriorates at locations on the wafer distant from the center of the deposition. Additionally, prior to the invention, the only devices obtainable with relatively high $V_m$ characteristics were those providing low values of current density, e.g., 25 amperes per square centimeter.

Figure 3:
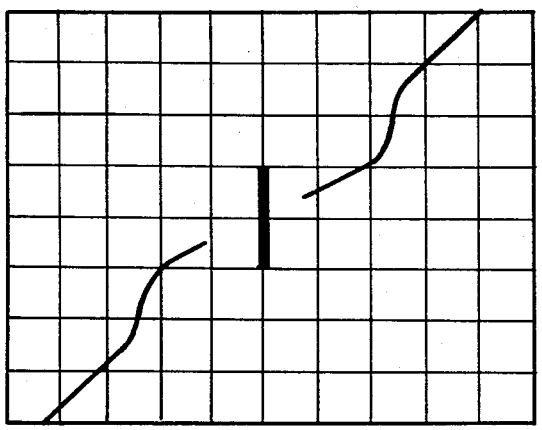
FIG. 3 is an I-V curve of a superconductive tunnel junction device fabricated without utilizing the present invention.
Figure 4:
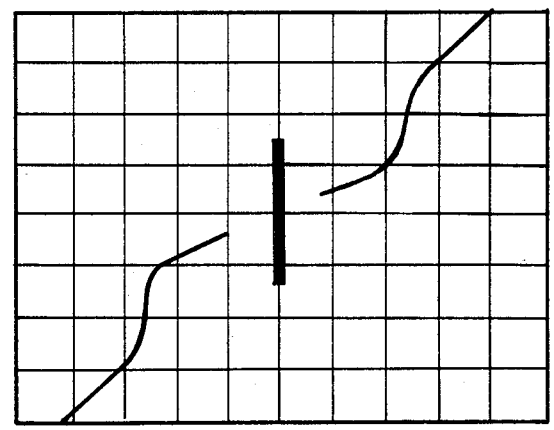
FIG. 4 is an I-V curve of a superconductive tunnel junction device fabricated in accordance with the present invention.

Referring to FIGS. 3 and 4, FIG. 3 illustrates the I-V characteristic of a niobium-silicon-niobium superconductive tunnel junction device with a current density of 2300 amperes per square centimeter fabricated without utilizing the present invention. FIG. 4 illustrates the I-V characteristic of a niobium-silicon-niobium superconductive tunnel junction device with a current density of 2900 amperes per square centimeter fabricated utilizing the present invention. It is appreciated by a comparison of FIG. 4, with FIG. 3, that the invention renders the I-V characteristic of the devices more ideal and therefore more useful. FIG. 4 exhibits, for example, a sharper jump at the energy gap than that of FIG. 3 thus contributing to the enhanced properties discussed above.

Although the invention was described in terms of introducing the ion bombardment of the lower superconductive electrode into a process of the type described in said Ser. No. 179,311, it is appreciated that the ion bombardment step of the present invention may be introduced into any fabrication process wherein the lower supeconductive electrode and the barrier are formed without breaking the vacuum system in which they are produced. The present invention results in improved device characteristics as well as uniformity of devices utilized in circuits. Although the invention was described in terms of utilizing a sputter etching step in an argon plasma, it is appreciated that other gaseous atmospheres may also be utilized in practicing the invention. For example, it is believed that xenon and the other noble gases as well as nitrogen may also be utilized. It is furthermore believed that the invention is useable with both deposited barriers and native oxide barriers.

While the invention has been described in its preferred embodiments, it is to be understood that the words which have been used are words of description rather than limitation and that changes may be made within the purview of the appended claims without departing from the true scope and spirit of the invention in its broader aspects.

We claim:

1. A method of manufacturing a superconductive tunnel junction device in a vacuum chamber comprising the steps of pumping the vacuum system down to vacuum, depositing a first layer of superconductive material on a substrate, bombarding said first layer of superconductive material with inert gas ions, providing a bombarded first superconductive layer, forming a barrier layer on said bombarded first superconductive layer, said bombarding step being performed prior to forming said barrier layer, said aforementioned steps being performed without breaking the vacuum system, and completing said superconductive tunnel junction device.

2. A method of claim 1 in which said bombarding step comprises sputter etching said first layer of superconductive material.

3. The method of claim 1 in which said bombarding step comprises sputter etching said first layer of superconductive material in an argon atmosphere.

4. The method of claim 1 in which said bombarding step comprises sputter etching said first layer of superconductive material in an argon plasma.

* * * * *